United States Patent
Feng et al.

(10) Patent No.: US 7,307,011 B2
(45) Date of Patent: Dec. 11, 2007

(54) STRUCTURE AND METHOD FOR FORMING A DIELECTRIC CHAMBER AND ELECTRONIC DEVICE INCLUDING THE DIELECTRIC CHAMBER

(75) Inventors: George C. Feng, Poughkeepsie, NY (US); Louis L. Hsu, Fishkill, NY (US); Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 11/129,325

(22) Filed: May 16, 2005

(65) Prior Publication Data

US 2005/0199977 A1    Sep. 15, 2005

Related U.S. Application Data

(62) Division of application No. 10/698,483, filed on Nov. 3, 2003, now Pat. No. 7,018,916.

(51) Int. Cl.
*H01L 21/4763* (2006.01)

(52) U.S. Cl. .............................. 438/619; 257/E21.573
(58) Field of Classification Search ................. 438/619
See application file for complete search history.

(56) References Cited

U.S. PATENT DOCUMENTS

| 5,444,015 A | 8/1995 | Aitken et al. |
| 6,013,536 A | 1/2000 | Nowak et al. |
| 6,057,224 A | 5/2000 | Bothra et al. |
| 6,509,623 B2 * | 1/2003 | Zhao .......................... 257/522 |

* cited by examiner

*Primary Examiner*—David A Zarneke
(74) *Attorney, Agent, or Firm*—McGinn IP Law Group, PLLC; Brian P. Verminski, Esq.

(57) ABSTRACT

A method (and structure) that selectively forms a dielectric chamber on an electronic device by forming a dummy structure over a semiconductor substrate, depositing a dielectric layer over the dummy structure, forming an opening through the dielectric layer to the dummy structure, and removing the dummy structure to form the dielectric chamber.

19 Claims, 9 Drawing Sheets

STRUCTURE AND METHOD FOR FORMING A DIELECTRIC CHAMBER AND ELECTRONIC DEVICE INCLUDING THE DIELECTRIC CHAMBER

The present Application is a Divisional Application of U.S. patent application Ser. No. 10/698,483, filed on Nov. 3, 2003 now U.S. Pat. No. 7,018,916.

BACKGROUND OF THE INVENTION

1. Field of the Invention

The present invention generally relates to a microelectronic structure and method for forming the microelectronic structure. More particularly, the present invention relates to a microelectronic structures (and methods) that includes a dielectric chamber in the vicinity of a device area.

2. Description of the Related Art

Conventional microelectronic structures (and methods) have attempted to form dielectric chambers, but have yet to successfully manufacture these chambers. One conventional attempt involves removing sacrificial material and leaving behind pillars to form a support on a semiconductor chip. However, the resulting structure is very unstable because it cannot sustain any mechanical stresses. For example, the resulting structure cannot be further processed with a chemical/mechanical polishing (CMP) process without failing.

Further, such attempts at forming air dielectric chambers have not been compatible with existing packaging methods because the random removal of material weakens the wire interconnects such that they cannot withstand any physical impact during processing of the chip package. Therefore, these attempts only randomly remove dielectric substances and cannot be successfully used in today's manufacturing environment.

These conventional methods also tend to trap residual chemicals that may cause reduced yield and reliability. Additionally, the resulting structures are often very weak and cannot protect the metalization levels of a microchip.

Additionally, these conventional methods do not protect the active circuits and devices during the random removal of the dielectric material, especially when a wet chemical is involved.

Thus, these conventional methods of forming dielectric chambers have not found popular use within production methods.

SUMMARY OF THE INVENTION

In view of the foregoing and other exemplary problems, drawbacks, and disadvantages of the conventional methods and structures, an exemplary feature of the present invention is to provide a method and structure in which an air dielectric chamber is selectively provided to a microelectronic device.

In a first exemplary aspect of the present invention, a method of forming a dielectric chamber in the vicinity of a semiconductor device area includes forming a dummy structure over a semiconductor substrate, depositing a dielectric layer over the dummy structure, forming an opening through the dielectric layer to the dummy structure, and removing the dummy structure to form a dielectric chamber.

In a second exemplary aspect of the present invention, a method of forming a dielectric chamber in the vicinity of a semiconductor device area includes forming a plurality of dummy structures over a semiconductor substrate, depositing a dielectric layer over the dummy structures, forming an opening through the dielectric layer to a selected one of the plurality of dummy structures, and removing the selected dummy structure to form a dielectric chamber.

In a third exemplary aspect of the present invention, an electronic device includes a semiconductor substrate, a plurality of conducting lines on the semiconductor substrate, a dielectric chamber between two of the plurality of conducting lines, and a polysilicon structure between another two of the plurality of conducting lines.

An exemplary embodiment of the method of the present invention provides a dielectric chamber in a microelectronic structure that has superb mechanical strength. The metalization layers are strongly and stably supported by the structure that results from the inventive method. These devices can not only withstand chemical/mechanical polishing processes, but are also compatible with existing packaging techniques.

An exemplary embodiment of the method of the present invention provides the ability to avoid contamination of the metalization in a device which includes dielectric chambers.

An exemplary embodiment of the method of the present invention may use chemical vapor deposition (CVD) of a polysilicon material to form a sacrificial (e.g., dummy) dielectric structure that may be subsequently removed without risking contamination.

An exemplary embodiment of the method of the present invention may use a damascene mandrel patterning technique to form dielectric chambers that are self-aligned with conductive wires.

An exemplary embodiment of the method of the present invention may take advantage of dummy structures that are only selectively removed such that any remaining dummy structures may form a high-density decoupling capacitor for power lines to enhance voltage regulation.

These and many other advantages may be achieved with the present invention.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Figure 1:
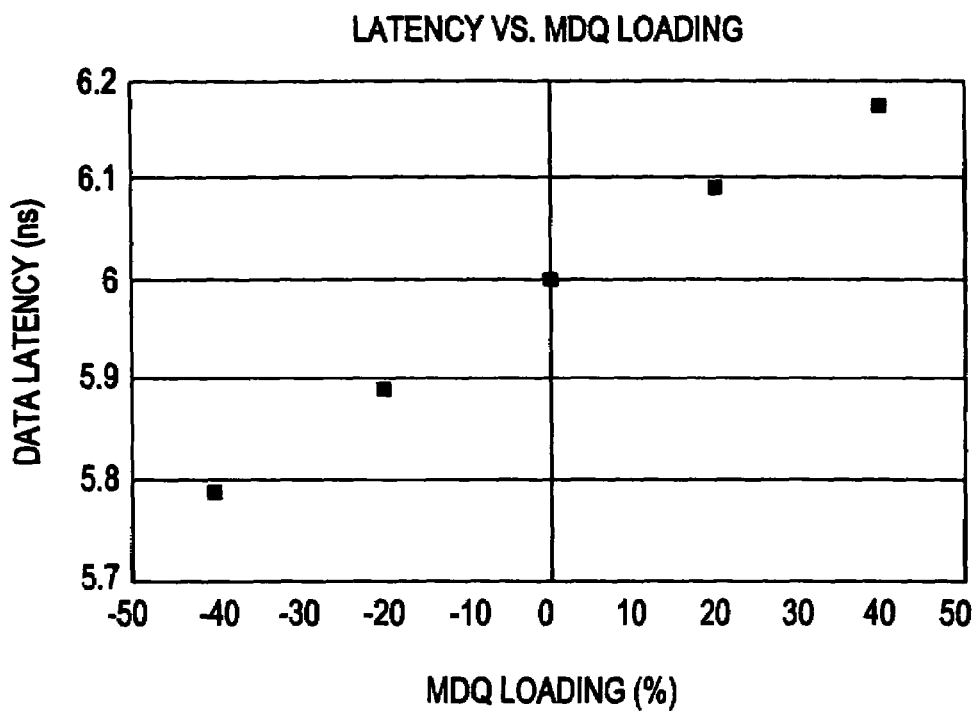
FIG. 1 shows a graph that illustrates the relationship between data line loading and data latency for a microelectronic device.

Referring now to the drawings, and more particularly to FIGS. 1-25, there are shown exemplary embodiments of the methods and structures of the present invention.

The following detailed description of exemplary embodiments provides three exemplary methods for forming reliable dielectric chambers. Each of these embodiments provides advantageous features.

The present invention may form a dielectric chamber before metal deposition. In other words, the present invention may form a dielectric chamber at a polysilicon gate conductor level, before the first insulating layer and before the first metal deposition layer that forms the first metal level. In this manner, the present invention may provide a structure having a high mechanical strength (e.g., strength that is sufficient to withstand any subsequent chip packaging processing without breakage), may avoid contamination and may significantly improve the resistance/capacitance even when the wiring is high density.

As illustrated by FIG. 1, as the density of the wiring (data line loading (i.e. master data queuing (MDQ) line loading)) increases as the data latency increases. For example, with nominal data line loading (MDQ loading % of zero), the data latency may be 6 nanoseconds. The present invention may reduce the line loading by adding the dielectric chamber and, as a result, may significantly reduce the data latency (e.g., on the order of 15-20%). Therefore, the dielectric chamber provided by the present invention may significantly improve the speed of microelectronic devices, because it reduces the over-all dielectric constant and, thus, improves the speed of the circuits.

As an example, the dielectric constant of oxide is about 3.9, the dielectric constant for a low dielectric material such as silicon is about 2.6, and the dielectric constant of air is only 1. Therefore, by replacing a conventional dielectric at the first metal level (M1) with the air dielectric chamber in accordance with the present invention, the performance of the circuit may be improved.

This effect is even more dramatic when the wiring dimensions are scaled down to the order of 0.15 μm and below.

Further, not only is the resistance-capacitance (or RC) delay improved but the line-to-line coupling may also be suppressed, because wire-to-wire capacitance is also reduced.

Further, the present invention may form a dielectric chamber between conducting wires and/or lines by using a hard dielectric plate to enhance the support within the resulting structure.

Additionally, the present invention may provide dummy wiring patterns that improve and provide uniform support. In this manner, the patterning quality may be improved, the decoupling capacitor size may be increased and the mechanical support may be improved.

Moreover, the present invention may use a polysilicon material as a sacrificial material that may be selectively removed using a downstream plasma etching process.

A typical downstream plasma etching process may be performed in a plasma reactor, where wafers are placed downstream from a plasma radiation exposure process, or not directly exposed to the plasma radiation. This kind of etching is done instead of using electron/ion bombardment. The downstream plasma etching process relies on isotropic reactive radicals that do not have high directional energy.

Therefore, since no metal is present in the device when forming the dielectric chamber in accordance with an exemplary embodiment of the invention, the process temperature is not a concern.

However, even when metal is present, the present invention may also be used at lower temperatures (i.e. less than about 350 degrees Celsius) to form the dielectric chamber. For example, the present invention may form a dielectric chamber at a metalization level higher than the first (device) level (e.g., M2, M3, etc.).

Further, any residual polysilicon material (dummy structure) may be used for devices within the microelectronic structure.

Additionally, the present invention does not require any extra steps to seal holes that may have been used to remove the sacrificial polysilicon material. Rather, these holes are automatically sealed in subsequent deposition steps.

An exemplary embodiment of the invention may form a dielectric chamber among high packing density polysilicon conductors. For example, polysilcon gates may be used to form word lines for memory circuits. The resistance-capacitance delay of the word lines is an important factor that may limit the performance of the memory circuit.

Thus, by using the present invention to introduce a dielectric chamber into these memory circuits, the rise and fall time of the word lines in these memory circuits may be significantly reduced, because the delay in the semiconductor structure that includes the dielectric chambers of the present invention is reduced. In particular, the capacitance in a semiconductor structure that includes the dielectric chamber of the present invention is reduced and since the delay is directly proportional to the capacitance, the delay is reduced.

First Exemplary Embodiment

Figure 12A:
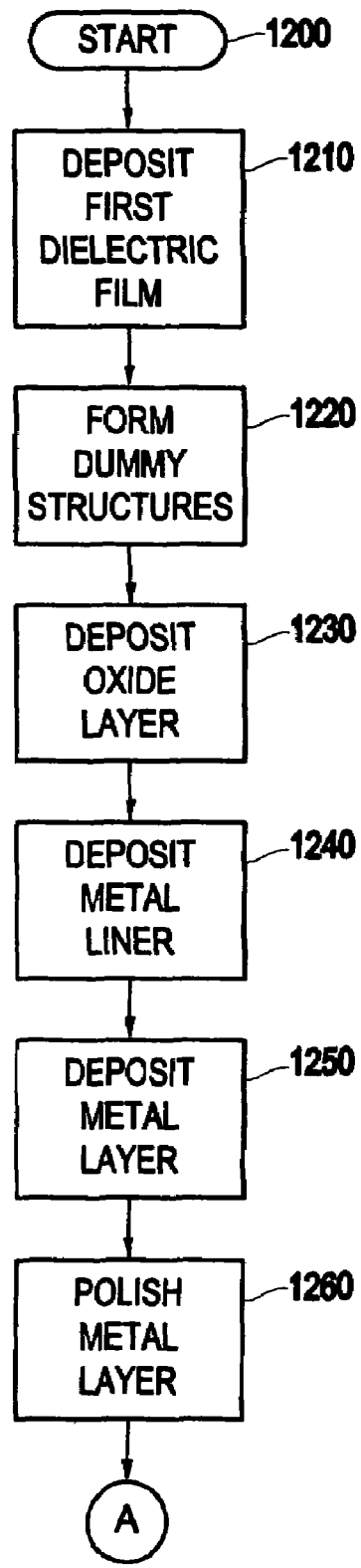
FIGS. 12A and 12B illustrate a flowchart that details the first exemplary method for forming the structure shown in FIGS. 10 and 11.
Figure 12B:
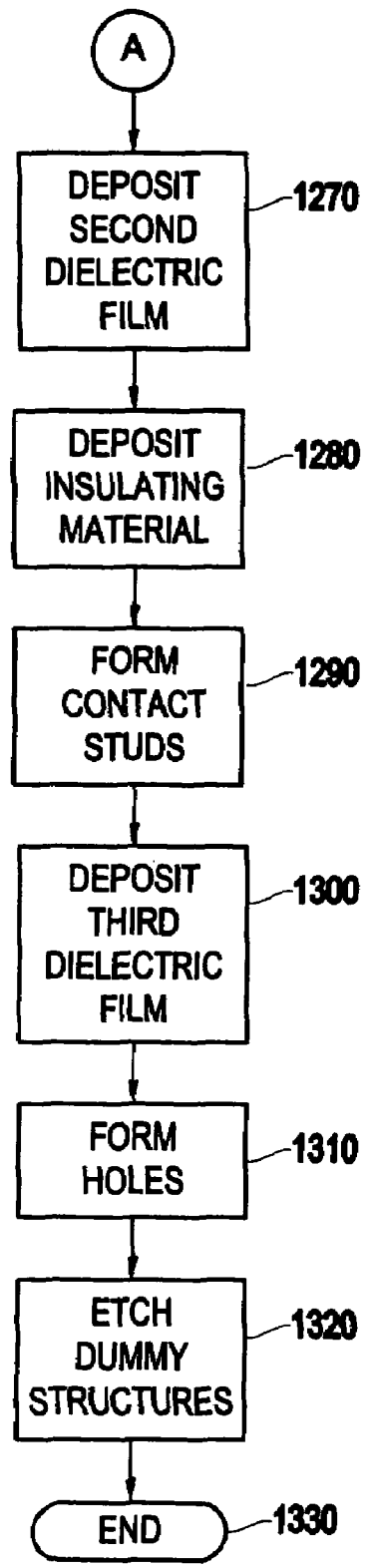

A first exemplary embodiment of the present invention is illustrated with reference to FIGS. 2-12B. The flowchart of FIGS. 12A and 12B illustrate the steps of this first exemplary method.

The first exemplary embodiment of the method of the present invention discloses how to form a dielectric chamber in the vicinity of a semiconductor device area, such as, for example, among high density first level wires. In this manner, the resistance-capacitance may be significantly reduced and thereby improve performance of the device.

Figure 2:
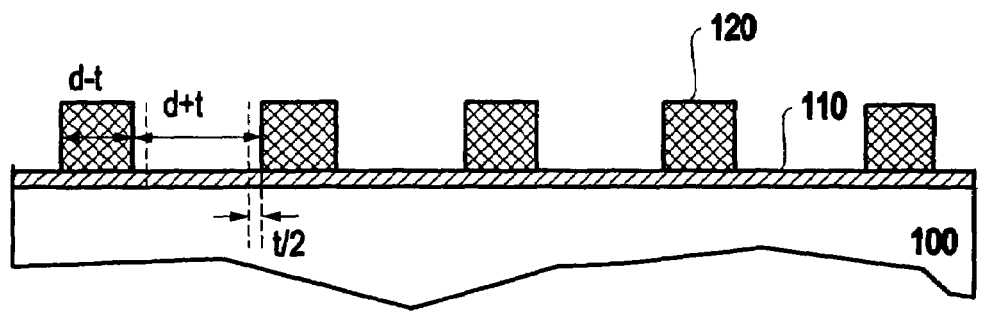
FIG. 2 shows dummy polysilicon structures 120 formed in accordance with a first exemplary method of the present invention.

The method starts at step 1200 and continues to step 1210 where, as shown in FIG. 2, a first dielectric film 110, such as a Nitride film, a CVD diamond film or the like, is deposited on a semiconductor substrate 100. The first dielectric film 110 may be deposited on the semiconductor substrate 100 by a chemical vapor deposition (CVD) process. Next, in step 1220, a polysilicon material may be deposited and patterned to form dummy structures 120. Each of the dummy structures 120 may be formed to have a width of d–t where d is the final desired device width and t is the thickness of two subsequent layers.

Figure 3:
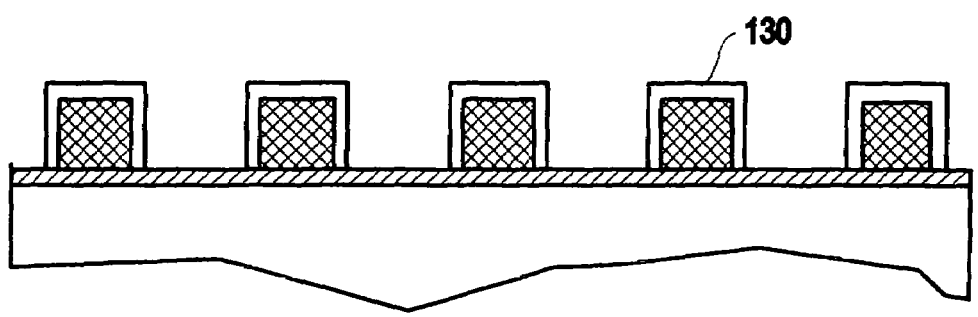
FIG. 3 shows an oxide layer 130 formed on the dummy polysilicon structures 120 in accordance with a first exemplary method of the present invention.
Figure 4:
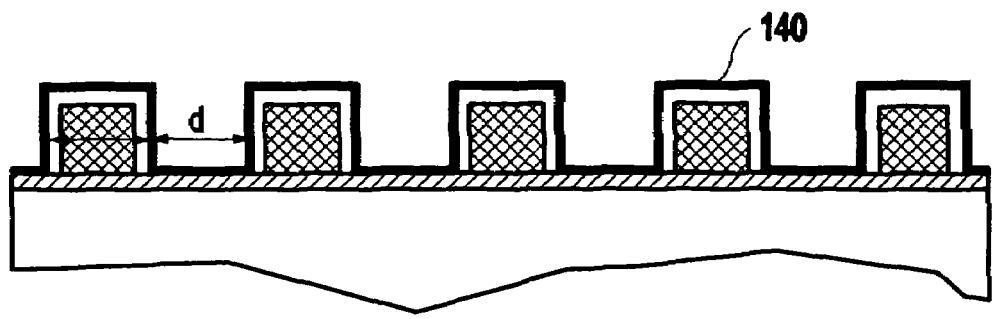
FIG. 4 shows a metal liner 140 formed on the structure of FIG. 3.

FIG. 3 illustrates an oxide layer 130 that is deposited in step 1230 at a thickness of ½ t on the dummy structures 120 in the next step. Then, in step 1240, a metal liner 140 (such as TiN, a CVD diamond or the like) is deposited as shown in FIG. 4.

Figure 5:
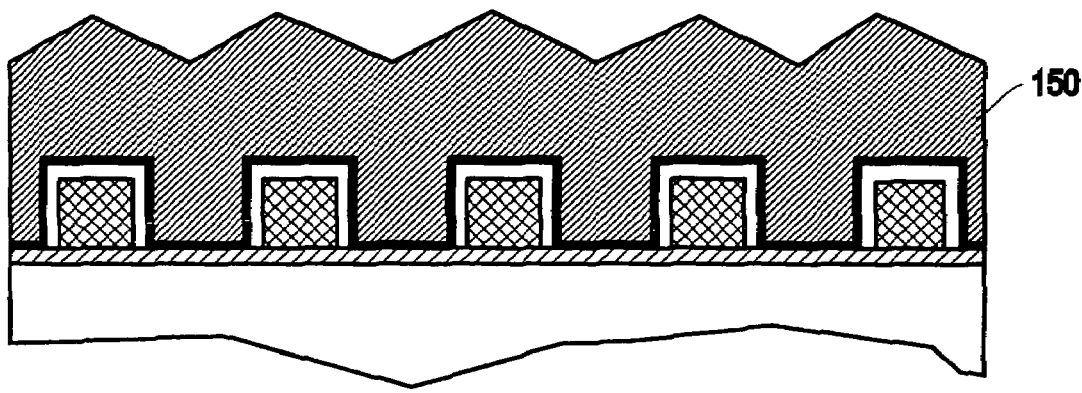
FIG. 5 shows a metal layer 150 deposited on the structure of FIG. 4.
Figure 6:
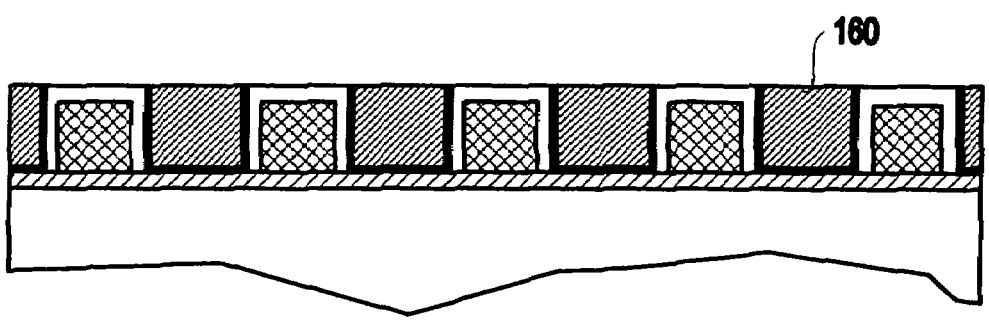
FIG. 6 shows metal lines 160 formed by polishing the metal layer of FIG. 5.

Next, as shown in FIG. 5, a metal layer 150 is deposited in step 1250 by, for example, chemical vapor deposition, sputtering or plating. Then, in step 1260, the metal layer 150 may be chemically/mechanically polished back to the surface of the oxide layer 130 to form metal lines 160 as shown in FIG. 6 using, for example, a damascene process.

Figure 7:
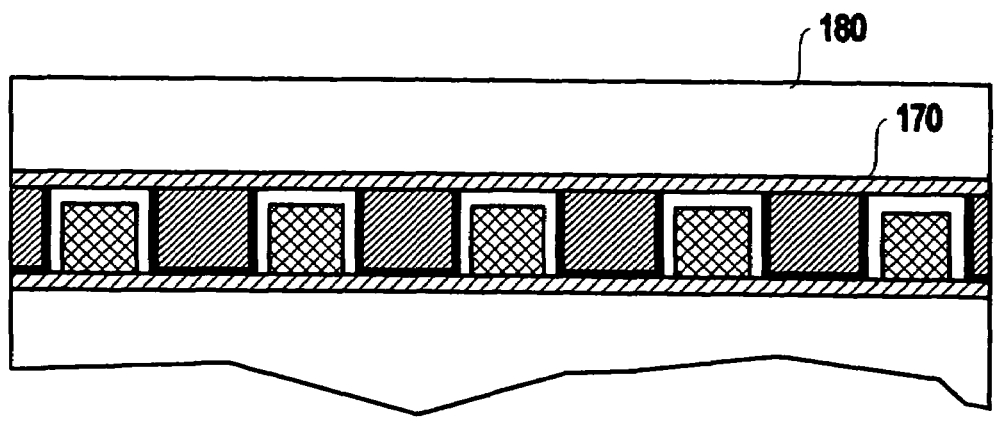
FIG. 7 shows a second dielectric layer 170 and an insulation layer 180 formed on the structure of FIG. 6.

Then, as shown in FIG. 7, a second dielectric film 170 (such as, for example, a CVD nitride) may be deposited in step 1270 and an insulating material 180 (such as, for example a CVD oxide) may be deposited on the second dielectric film 170 in step 1280. The second dielectric film 170 may form a portion of the structural support for the resulting dielectric chamber which is formed as described below.

Figure 8:
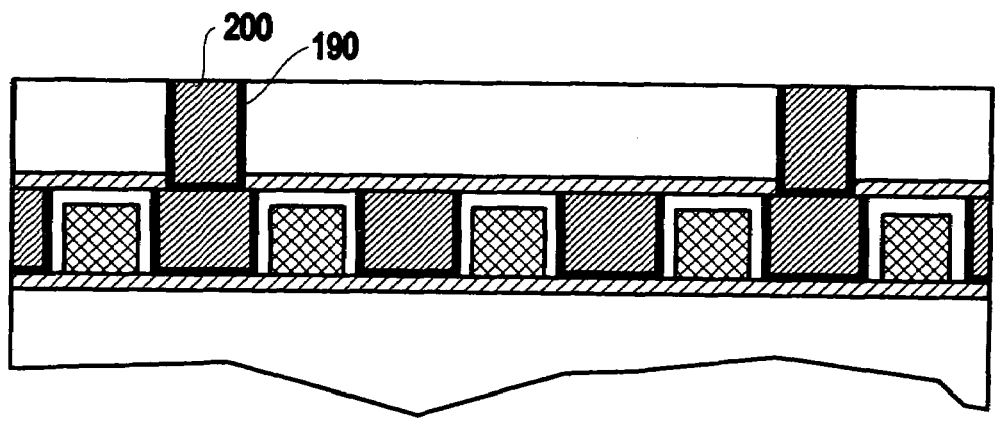
FIG. 8 shows contact studs 200 formed in the structure of FIG. 7.
Figure 9:
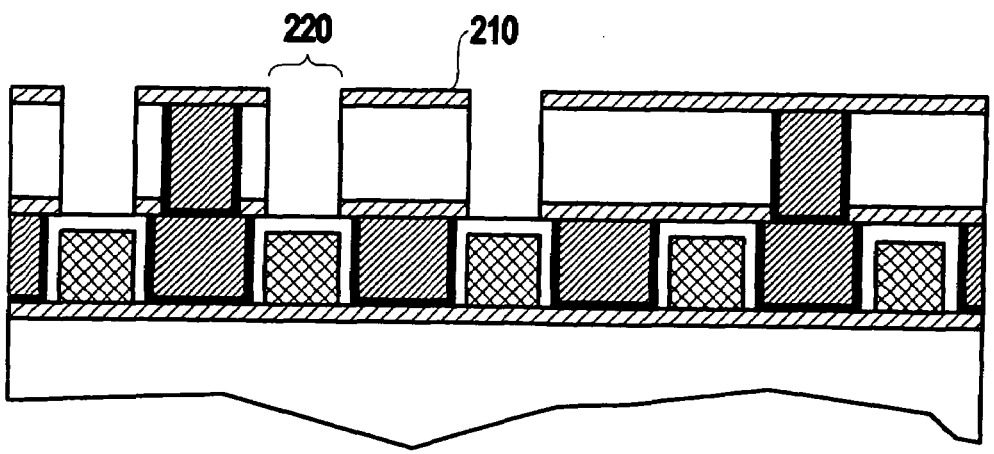
FIG. 9 shows holes 220 formed in the structure of FIG. 8.

Next, in step 1290, contact studs 200 having a metal line 190 are formed as shown in FIG. 8 using, for example, a conventional Damascene process. Then, in step 1300, a third dielectric film 210 may be deposited and holes 220 may then be formed through the third dielectric film 210, the insulating layer 180, the second dielectric film 170, and the oxide layer 130 in step 1310.

Figures 10, 11:
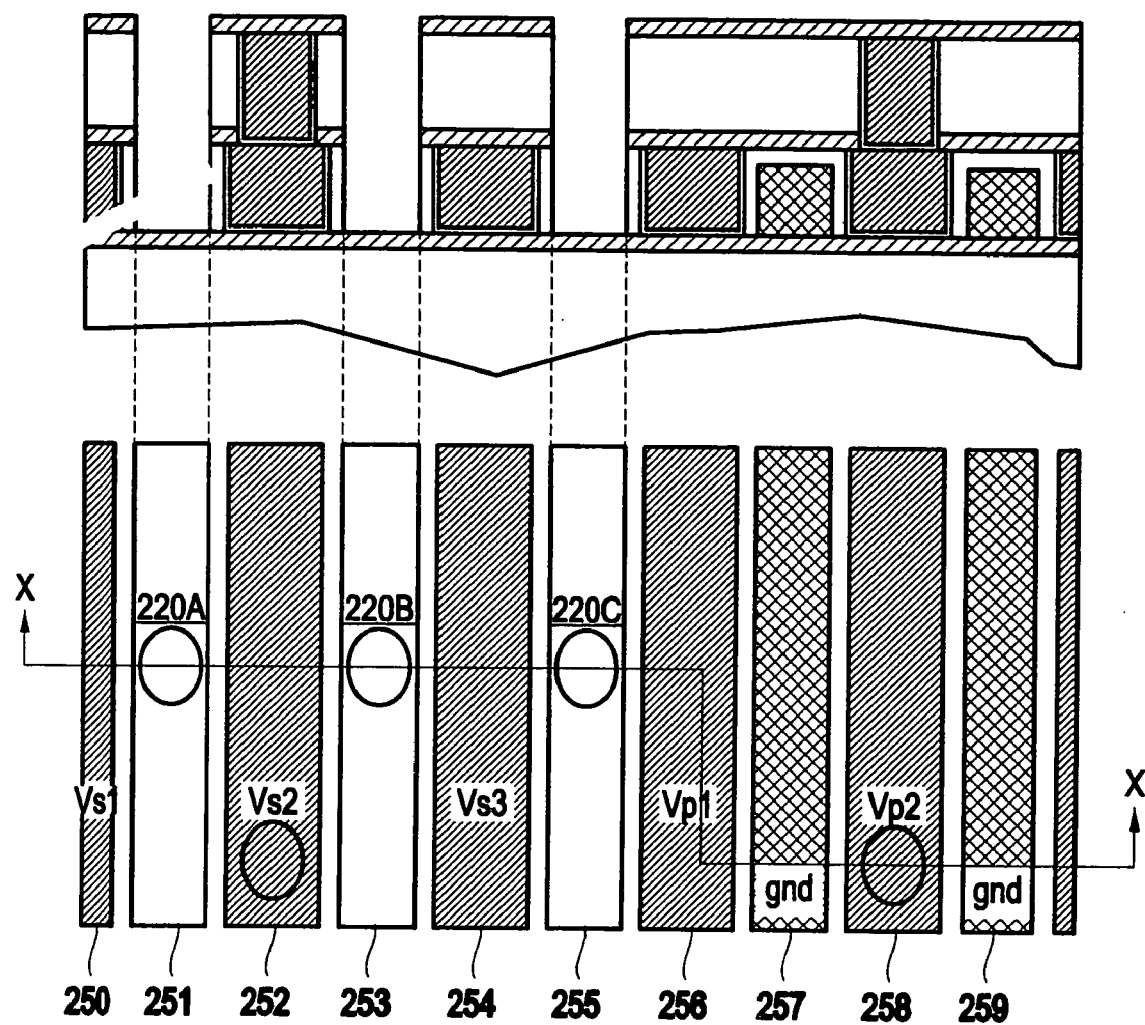
FIG. 10 shows dielectric chambers formed by removing the dummy polysilicon material from the structure of FIG. 9.
FIG. 11 shows a plan view of the structure of FIG. 10.

Then, in step 1320, as shown in FIGS. 10 and 11, the dummy structures 120 below the holes 220 may be removed using a downstream plasma etching process that does not leave a residue within the dielectric chambers 251, 253, and 255.

The dielectric chambers may be filled with air or an inert gas, such as Argon or Nitrogen. The inert gas avoids the accumulation of moisture within the dielectric chamber that may become trapped after the dielectric chamber is sealed.

The microelectronic structure 270 shown in FIG. 11 includes metal wirings 250, 252, and 254 having the dielectric chambers 251, 253, and 255 interleaved with them so that the line to line capacitance between the metal wirings 250, 252, and 254 is significantly reduced.

Additionally, the microelectronic structure 270 shown in FIG. 11 includes metal wirings 256 and 258 that may form power lines that have grounded polysilicon wirings 257 and 259 between them to form decoupling capacitors. These polysilicon wirings 257 and 259 are formed from the residual dummy structures 120 which were not removed during the downstream plasma etching process because they were not exposed by the holes 220 to the etching process.

The first exemplary embodiment of the present invention is capable of successfully providing dielectric chambers while providing a structure that is strong enough such that it will not be damaged by subsequent processing.

Further, this first exemplary embodiment of the present invention is compatible with existing packaging methods such as, for example, wire bonding, ball grid array, plastic, silicon packaging, or the like.

Additionally, the first exemplary embodiment of the invention does not trap residual chemicals and, therefore, does not suffer from reduced yield and reliability.

Moreover, the first exemplary embodiment of the present invention protects the active circuits and devices during processing.

The first exemplary embodiment of the method of the present invention discloses how to form a dielectric chamber among high density first level wires (M1). In this manner, the resistance-capacitance may be significantly reduced and thereby improve performance of the device.

Second Exemplary Embodiment

Figure 13:
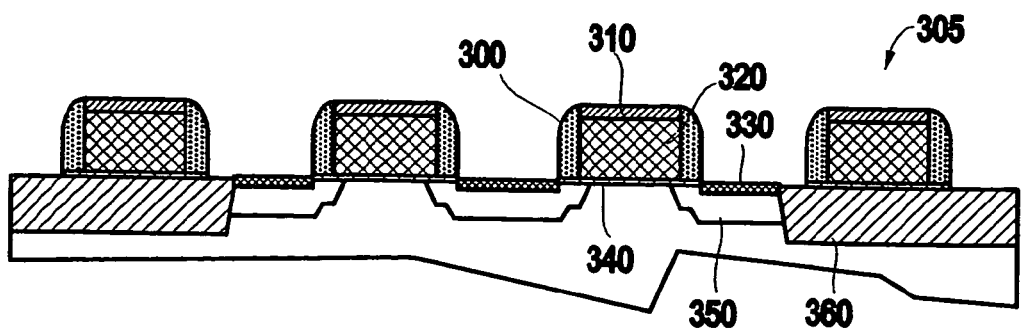
FIG. 13 shows gate structures formed in preparation receiving dielectric chambers in accordance with a second exemplary method in accordance with the present invention.

A second exemplary embodiment of the present invention is illustrated with reference to FIGS. 13-19 which provides dielectric chambers in the vicinity of a semiconductor device area. As shown in FIG. 13, a plurality of polysilicon gates 305 are formed having a cap material 310, a chemical/vapor polysilicon gate body 320, a gate oxide 340, side wall spacers 300, diffusion junctions 350 and silicide source and drain areas 330. The gate structures 305 are isolated by shallow trench isolators 360.

Figure 14:
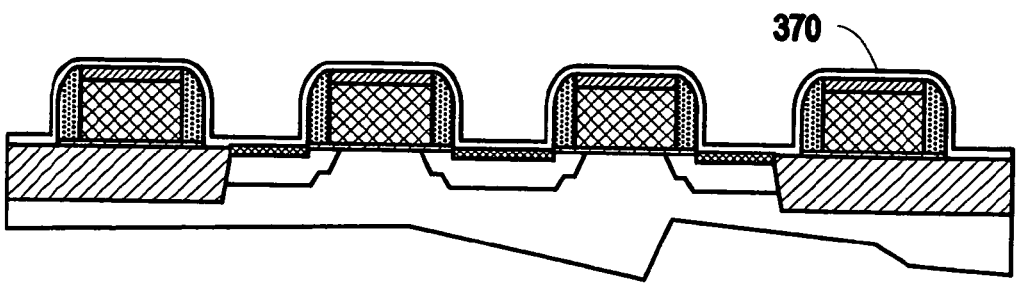
FIG. 14 illustrates a dielectric film 370 formed on the structure of FIG. 13.
Figure 15:
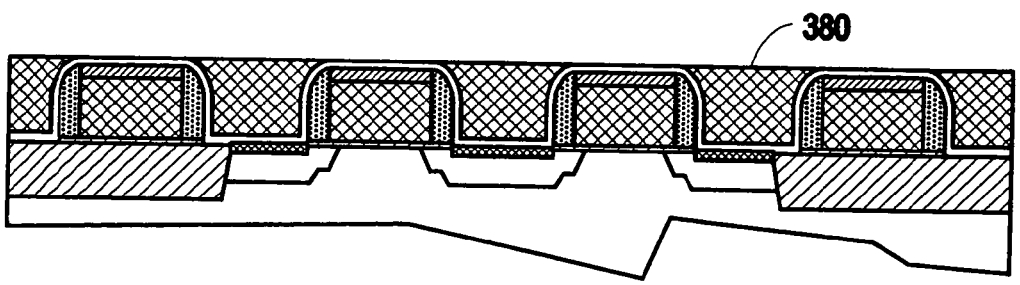
FIG. 15 illustrates a dummy polysilicon material 380 formed between the gate structures of FIG. 14.

Next, a thin dielectric film 370 may be deposited on the surface of the polysilicon gate structures 305 as shown in FIG. 14. Then, as shown in FIG. 15, a polysilicon layer is deposited and polished back to leave polysilicon material 380 between the gate structures 305.

Figure 16:
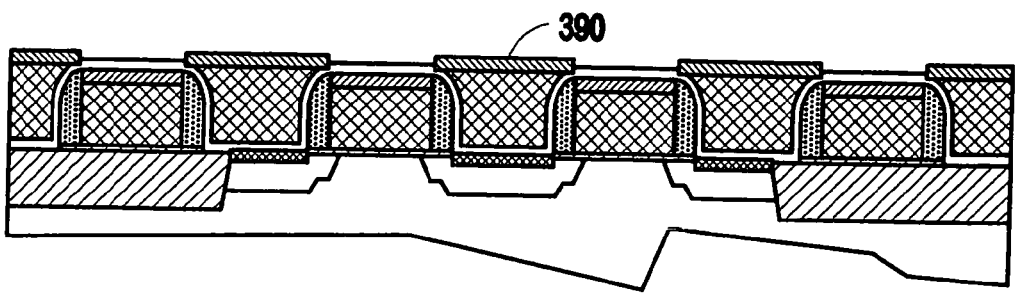
FIG. 16 illustrates a second dielectric film 390 formed over the dummy polysilicon material of FIG. 15.
Figure 17:
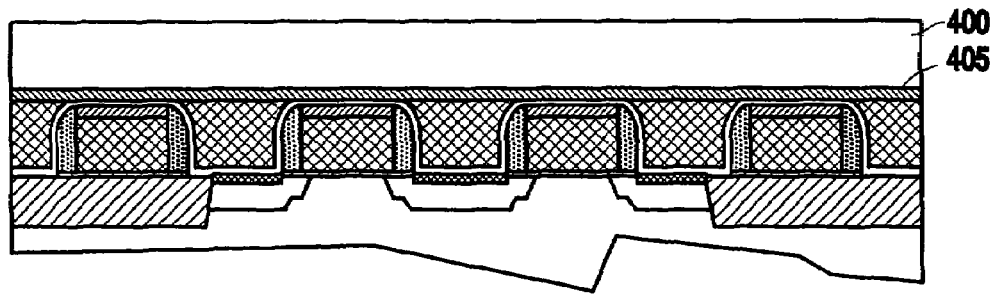
FIG. 17 illustrates a third dielectric film 405 and an insulating material 400 formed on the structure of FIG. 16.

Next, an oxide layer 390 may optionally be deposited on the polysilicon material 380, as shown in FIG. 16. Then, as shown in FIG. 17, a thin nitride film 405 may be deposited over the oxide layer 390 and an insulation material 400 may be deposited over the nitride film 405.

Figure 18:
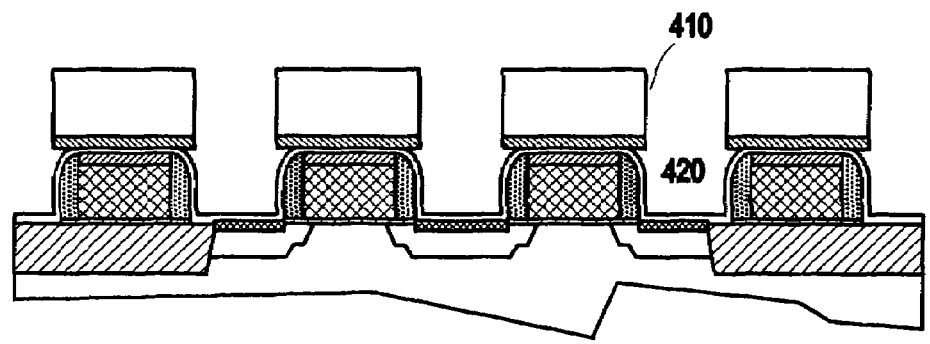
FIG. 18 illustrates holes 410 through which the dummy polysilicon material has been removed to form dielectric chambers.

Next, as shown in FIG. 18, holes 410 may be formed through the insulation material 400 and the nitride film 405 and then the dummy polysilicon material 380 may be removed using a downstream plasma etching process to provide dielectric chambers 420.

Figure 19:
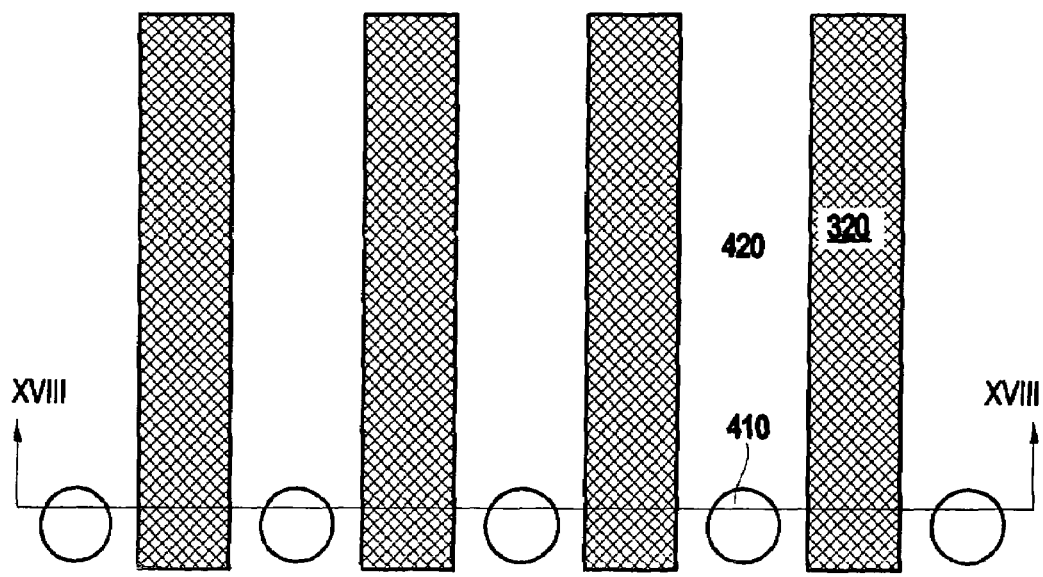
FIG. 19 shows a plan view of the structure of FIG. 18.

FIG. 19 shows a plan view of the polysilicon gate bodies 320 having dielectric chambers 420 disposed between them and the holes 410 through which the dummy polysilicon material 380 is removed. While FIG. 19 shows that the holes 410 are aligned, one of ordinary skill in the art appreciates that these holes do not require alignment. Further, while FIG. 19 also appears to show only a single hole for each dielectric chamber, one of ordinary skill in the art understands that multiple holes may be provided for each dielectric chamber in accordance with the present invention.

Thus, while the first exemplary embodiment illustrated how dielectric chambers may be formed in the vicinity of a semiconductor device area, such as, along with a first layer of device wiring, the second exemplary embodiment illustrates how dielectric chambers may be formed in the vicinity of a semiconductor device area, such as among pre-existing devices (such as transistor gates, wiring, etc.)

Therefore, the second exemplary embodiment reduces the dielectric constant of a high-density device and the circuit level to improve the circuit performance while preserving the structural strength of the device.

Third Exemplary Embodiment

Figure 20:
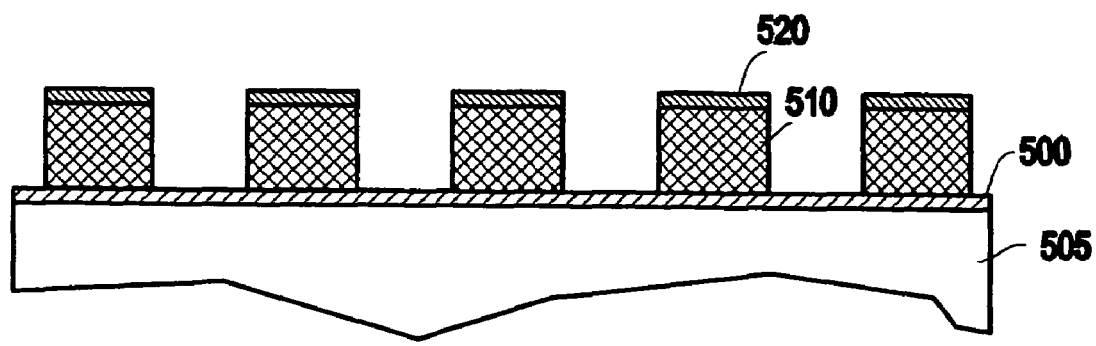
FIG. 20 shows dummy polysilicon structures formed in accordance with a third exemplary method of the present invention.

FIGS. 20-24 illustrate a third exemplary method in accordance with the present invention. As shown in FIG. 20, dummy polysilicon structures 510 are deposited on a first dielectric film 500 that was deposited on a semiconductor substrate 505. A second dielectric layer 520 is patterned on the dummy polysilicon structures 510.

Figure 21:
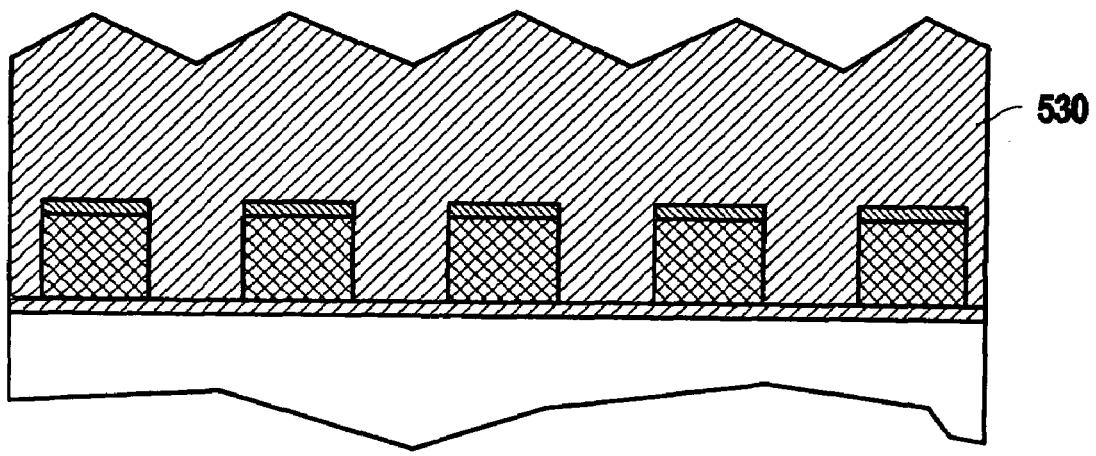
FIG. 21 shows an insulating material 530 formed on the structure of FIG. 20.

Next, as shown in FIG. 21, an insulating material 530 is deposited using, for example, a chemical vapor deposition process.

Figure 22:
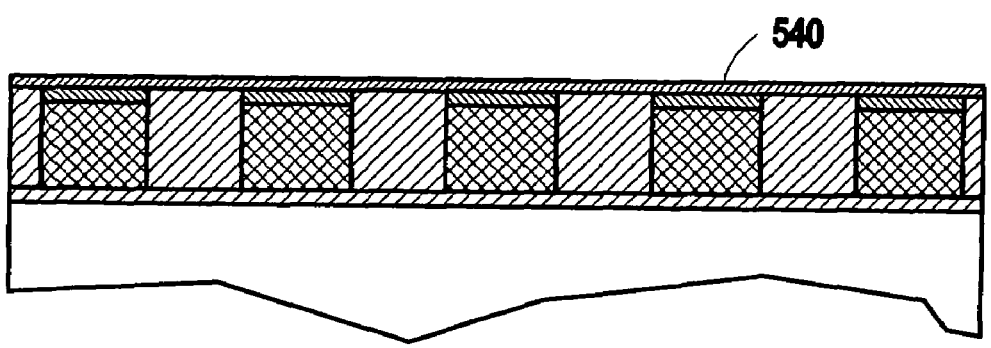
FIG. 22 shows another dielectric layer 540 deposited on the polished insulating material 530 of FIG. 21.

Then, as shown in FIG. 22, the insulating material 530 may be chemically/mechanically polished to the second dielectric layer and then a third dielectric layer 540 is deposited.

Figure 23:
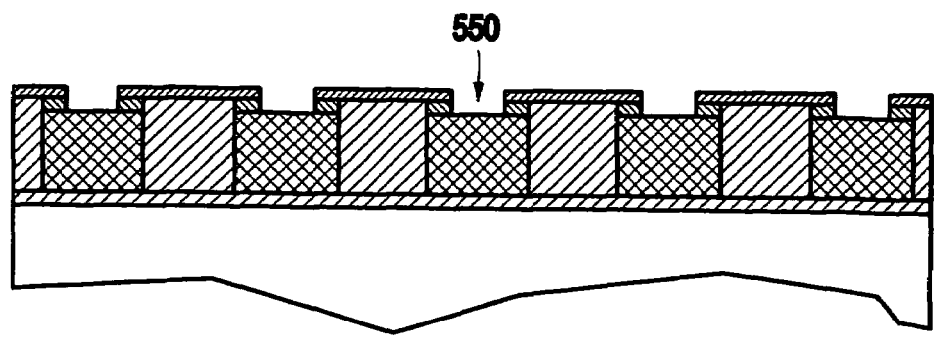
FIG. 23 shows holes 550 formed in the structure of FIG. 22.
Figure 24:
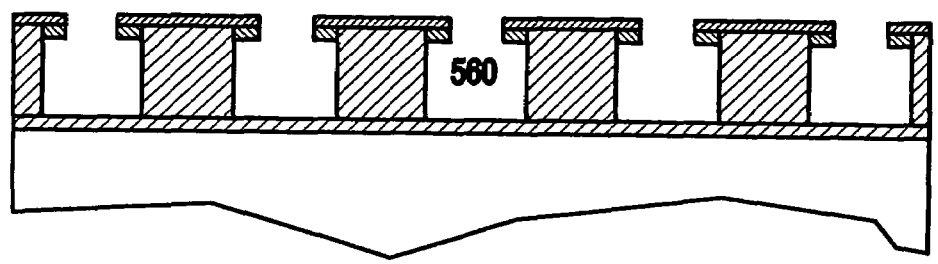
FIG. 24 shows the dummy polysilicon material removed through the holes of FIG. 23 to form dielectric chambers.

Next, holes 550 are formed in the third dielectric layer 540 and the second dielectric layer 520 as shown in FIG. 23 and the dummy polysilicon structures 510 may then be removed using a downstream plasma etching process to provide the dielectric chambers 560 shown in FIG. 24.

Thus, in this third exemplary embodiment of the invention, the dielectric chambers may be provided in a layer of a semiconductor device that does not necessarily include wiring or semiconductor devices. Rather, as is shown in FIG. 25 (explained below) these dielectric chambers of the present invention may be formed in any layer or multiple layers of a semiconductor structure.

Figure 25:
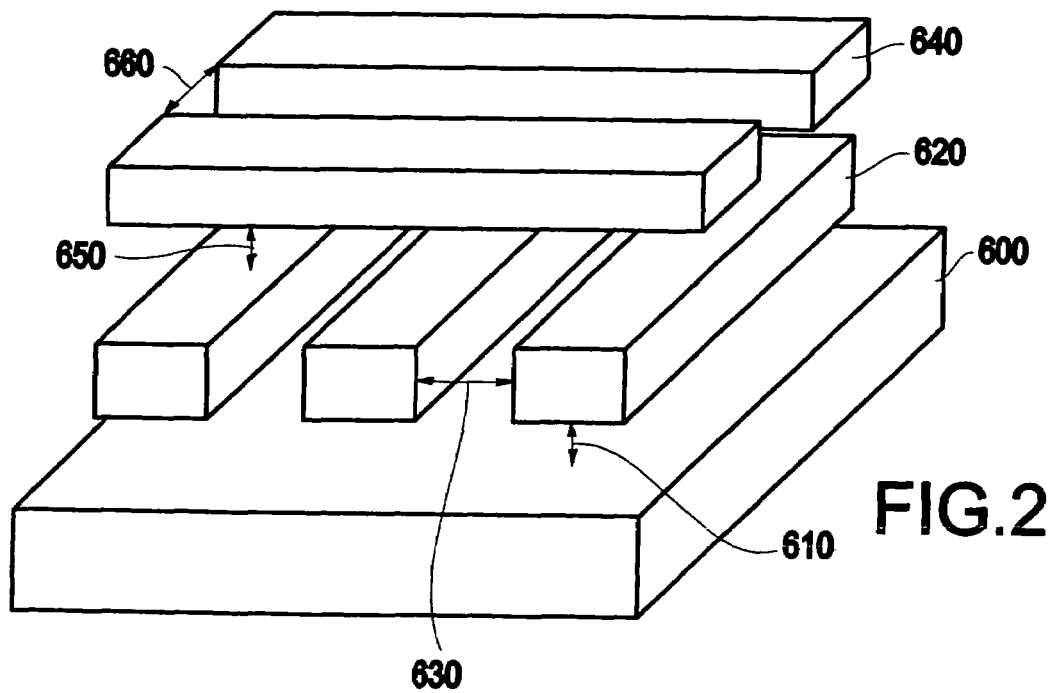
FIG. 25 illustrates the dielectric chambers dispersed vertically as well as horizontally between conductors in accordance with an exemplary embodiment of the invention.

FIG. 25 illustrates how the present invention may be applied to an electronic device to include dielectric chambers both horizontally and vertically disposed among multiple levels of conductive lines. For example, FIG. 25 shows a substrate 600 which includes a first dielectric chamber 610 at a first level that is below a first set of conductive lines 620 that have dielectric chambers 630 between the conductive lines at a second level.

Further, FIG. 25 illustrates a second set of conductive lines 640 on a fourth level which is separated from the first set of conductive lines 620 on the second level by dielectric chambers 650 at a third level between the second and fourth levels.

Also, dielectric chambers 660 may be formed in the fourth layer amongst the second set of conductive lines 640.

Moreover, as shown by FIG. 25, the second set of conductive lines 640 may cross the first set of conductive lines 620.

The multiple levels of dielectric chambers 610, 630, 650, and 660 of dielectric chambers among the conductive lines 620 and 640 may, for example, be formed in a single downstream plasma etching process, in a manner very similar to the process explained above for forming a single level of dielectric chambers.

While the invention has been described in terms of several exemplary embodiments, those skilled in the art will recognize that the invention can be practiced with modification.

Further, it is noted that, Applicants' intent is to encompass equivalents of all claim elements, even if amended later during prosecution.

What is claimed is:

1. An electronic device comprising:
   a semiconductor substrate;
   a plurality of conducting lines on the semiconductor substrate;
   a dielectric chamber between two of the plurality of conducting lines; and
   a structure between another two of the plurality of conducting lines,
   wherein the plurality of conducting lines comprise a plurality of polysilicon gate structures.

2. The device of claim 1, wherein the dielectric chamber is filled with a gas.

3. The device of claim 2, wherein the gas comprises air.

4. The device of claim 2, wherein the gas comprises an inert gas.

5. The device of claim 1, further comprising a dielectric layer over the dielectric chamber.

6. The device of claim 5, wherein the dielectric layer defines an opening over the dielectric chamber.

7. The device of claim 1, wherein said dielectric chamber is formed in one of the active layer, the passive layer, and the first metal layer.

8. An electronic device comprising:
   a semiconductor substrate;
   a first set of conducting lines over the semiconductor substrate;
   a second set of conducting lines over the first set of conducting lines; and
   a dielectric chamber between the first set of conducting lines and the second set of conducting lines,
   wherein the conducting lines comprise a plurality of polysilicon gate structures.

9. The device of claim 8, further comprising another dielectric chamber between one of two conducting lines in the first set of conducting lines and two conducting lines in the second set of conducting lines.

10. The device of claim 8, further comprising another dielectric chamber between said first set of conducting lines and said semiconductor substrate.

11. The device of claim 8, wherein the second set of conductive lines cross the first set of conductive lines.

12. A semiconductor structure, comprising:
    a semiconductor substrate;
    a plurality of conducting lines on the semiconductor substrate;
    a dielectric chamber between two of the plurality of conducting lines; and
    a structure between another two of the plurality of conducting lines,
    wherein the plurality of conducting lines comprise a plurality of polysilicon gate structures.

13. The device of claim 12, wherein the dielectric chamber is filled with a gas.

14. The device of claim 13, wherein the gas comprises air.

15. The device of claim 13, wherein the gas comprises an inert gas.

16. The device of claim 12, further comprising a dielectric layer over the dielectric chamber.

17. The device of claim 15, wherein the dielectric layer defines an opening over the dielectric chamber.

18. The device of claim 12, wherein said dielectric chamber is formed in one of the active layer, the passive layer, and the first metal layer.

19. The device of claim 1, wherein said structure comprises a polysilicon wiring.

* * * * *